(12) United States Patent
Tseng et al.

(10) Patent No.: US 12,550,266 B2
(45) Date of Patent: Feb. 10, 2026

(54) STORAGE MODULE DOUBLE-LAYER POSITIONING DEVICE SET

(71) Applicant: HANWIT PRECISION INDUSTRIES LTD., New Taipei (TW)

(72) Inventors: Ying-Chih Tseng, New Taipei (TW); Ming-De Wu, New Taipei (TW); Ching-Kai Chang, New Taipei (TW)

(73) Assignee: HANWIT PRECISION INDUSTRIES LTD., New Taipei (TW)

( * ) Notice: Subject to any disclaimer, the term of this patent is extended or adjusted under 35 U.S.C. 154(b) by 198 days.

(21) Appl. No.: 18/428,599

(22) Filed: Jan. 31, 2024

(65) Prior Publication Data

US 2025/0247961 A1    Jul. 31, 2025

(51) Int. Cl.
*H05K 1/181*    (2026.01)

(52) U.S. Cl.
CPC ... *H05K 1/181* (2013.01); *H05K 2201/10189* (2013.01); *H05K 2201/10409* (2013.01); *H05K 2201/2027* (2013.01)

(58) Field of Classification Search
CPC .................................................... H05K 1/181
See application file for complete search history.

(56) References Cited

U.S. PATENT DOCUMENTS

| | | | |
|---|---|---|---|
| 2014/0213078 A1* | 7/2014 | Huang | H01R 12/721 439/76.1 |
| 2020/0244008 A1* | 7/2020 | Wu | F16B 21/02 |
| 2022/0200061 A1* | 6/2022 | Inamura | H01M 50/244 |
| 2024/0414904 A1* | 12/2024 | Tseng | G06F 1/186 |
| 2025/0021140 A1* | 1/2025 | Tseng | G06F 1/185 |
| 2025/0261316 A1* | 8/2025 | Tseng | H05K 3/368 |
| 2025/0287521 A1* | 9/2025 | Tseng | H05K 7/1489 |

FOREIGN PATENT DOCUMENTS

WO    WO-2018067069 A2 *    4/2018    ......... H01R 12/722

* cited by examiner

*Primary Examiner* — Stanley Tso
(74) *Attorney, Agent, or Firm* — MUNCY, GEISSLER, OLDS & LOWE, P.C.

(57) ABSTRACT

A storage module double-layer positioning device set includes a storage module and two positioning devices arranged on two sides of the circuit board of the storage module in a staggered manner. Each positioning device includes a base with an accommodating chamber, two slideways, two side guide plates, a limiting groove, a blocking wall, a positioning block and a positioning unit; a retaining member having a horizontal portion with a pushing portion and an operating portion, a vertical portion extending inserted into the accommodating chamber, a connecting plate connected to the vertical portion, and two positioning blocks respectively inserted into the limiting grooves of the base to form positioning; an elastic member set in the accommodating chamber and stopped between the vertical portion and the blocking wall; and a sliding shaft running through the connecting plate and the elastic member with two opposite ends thereof respectively positioned in the two slideways.

9 Claims, 10 Drawing Sheets

STORAGE MODULE DOUBLE-LAYER POSITIONING DEVICE SET

BACKGROUND OF THE INVENTION

1. Field of the Invention

The invention provides a storage module double-layer positioning device set, particularly a storage module whose circuit board is provided with an electrical connector, an interface card and a positioning device on each of both sides of the circuit board. The two positioning devices are locked to the circuit board through fasteners to increase stability. At the same time, the two positioning devices are arranged staggered in the circuit board to reduce the overall thickness of the storage module, and the two interface cards are respectively positioned on the upper and lower layers of the circuit board and are electrically connected through corresponding electrical connectors to form a high-density stacked storage capacity. Through this circuit layout form, circuits can be laid on both sides of the circuit board to reduce plated through holes. In addition to simplifying the circuit complexity and thereby reducing the overall manufacturing cost of the storage module.

2. Description of the Related Art

The rapid development of the electronics industry has caused the computing performance of computers or servers to double. In addition to the main components of the computer including the motherboard, central processing unit, memory and storage device, the motherboard is also equipped with a variety of connectors with different interfaces to expand various peripheral devices. To expand various peripheral devices, interface cards are provided with a plurality of electronic components and corresponding circuit layouts, and their terminals are represented by a plurality of metal contacts. By inserting the interface card into the connector on the motherboard, the two devices can be electrically connected to expand the functions of the motherboard.

Furthermore, in order to insert more storage devices into the server or industrial computer (IPC), those who have requirements for the reading and writing speed of electronic data will use solid-state drives (SSD) with small size and high storage capacity. But how to install multiple solid-state drive cards with m.2 specifications in limited space. However, it is common knowledge that a storage module can only install one solid-state drive card, which cannot significantly increase the storage capacity in the limited space of a server or industrial computer. Therefore, the aforementioned problems need to be developed and solved by those engaged in this industry.

SUMMARY OF THE INVENTION

Therefore, in view of the above-mentioned problems and deficiencies, the inventor collected relevant information, and after multiple evaluations and considerations, he designed the invention of this storage module double-layer positioning device set.

The main object of the present invention is to provide a storage module double-layer positioning device set, which comprises a storage module with a circuit board, and a plurality of positioning devices arranged on opposing first and second surfaces of the circuit board of the storage module in a staggered manner. Each positioning device comprises a base, a retaining member, an elastic member and a sliding shaft. The base comprises an accommodating chamber inside, two slideways respectively formed on two opposite sides of the accommodating chamber, a side guide plate above each of the two slideways, a limiting groove formed between each side guide plate and one respective slideway, a blocking wall formed corresponding to the rear side of the accommodating chamber, a positioning block formed on the front side of the base, and a positioning unit extending downward from the bottom side of the base and a fixing part extending laterally. The retaining member comprises a horizontal portion with a pushing portion at the front end and an operating portion at the opposing rear end, a vertical portion extending downward from the bottom side of the pushing portion and inserted into the accommodating chamber of the base, a connecting plate connected to the vertical portion, and two positioning blocks respectively located on two opposite lateral sides of the vertical portion and respectively inserted into the limiting grooves of the base to form positioning. The elastic member is set in the accommodating chamber of the base with two resisting end portions thereof respectively stopped against the vertical portion and the blocking wall. The sliding shaft runs through the connecting plate and the elastic member with two opposite ends thereof respectively positioned in the two slideways. With the above composition, the circuit board of the storage module is equipped with electrical connectors, interface cards and positioning devices on both sides. The two positioning devices are locked to the circuit board through fasteners to increase stability. At the same time, the two positioning devices are arranged staggered in the circuit board to reduce the overall thickness of the storage module, and the two interface cards are respectively positioned on the upper and lower layers of the circuit board and are electrically connected through corresponding electrical connectors to form a high-density stacked storage capacity. Through this circuit layout form, circuits can be laid on both sides of the circuit board to reduce plated through holes (PTH). In addition to simplifying the circuit complexity and thereby reducing the overall manufacturing cost of the storage module.

It is another object of the present invention is to provide a storage module double-layer positioning device set, wherein the positioning unit of the base comprises a positioning plate that extends into a wide part of a positioning groove on the circuit board and slides to a narrow part of the positioning groove of the circuit board to form positioning, and a wing plate extending outward from the positioning plate; the fixing part of the base is provided with a lock hole, that is locked to a fixing hole on the circuit board by a fastener, such as a screw; the circuit board is provided with an electrical connector on each of the opposing first and second surfaces.

It is still another object of the present invention is to provide a storage module double-layer positioning device set, wherein the wing plate is further provided with a resisting rib on the top surface thereof that smoothly abuts against the narrow part of the positioning groove of the circuit board.

It is still another object of the present invention is to provide a storage module double-layer positioning device set, wherein the retaining member further comprises two limiting blocks extending from the horizontal portion toward the connecting plate on both sides to limit the resisting end portions of the elastic member, and each of the limiting blocks and the vertical portion define a respective limiting space for accommodating the resisting end portions of the elastic member respectively.

DETAILED DESCRIPTION OF THE INVENTION

In order to achieve the above objects and effects, the technical means and structures adopted by the present invention are described in detail below with respect to the preferred embodiment of the present invention, so as to facilitate a complete understanding.

Referring to FIGS. 1-6, which are a three-dimensional view of an embodiment of a storage module double-layer positioning device set of the present invention, another three-dimensional view of the embodiment of the storage module double-layer positioning device set of the present invention, a three-dimensional exploded view of the embodiment of the storage module double-layer positioning device set of the present invention, another three-dimensional exploded view of the embodiment of the storage module double-layer positioning device set of the present invention, a three-dimensional exploded view of the positioning device of the present invention, and another three-dimensional exploded view of the positioning device of the present invention. The storage module double-layer positioning device set of the present invention comprises a storage module 5 comprising a circuit board 51, and a plurality of positioning devices positioned on opposing first and second surfaces of the circuit board 51 in a staggered manner. The positioning device comprises a base 1, a retaining member 2, an elastic member 3 and a sliding shaft 4. Its main components and features are detailed as follows:

The base 1 comprises an accommodating chamber 10 inside, two slideways 101 respectively formed on two opposite sides of the accommodating chamber 10, a side guide plate 11 above each of the two slideways 101, a limiting groove 102 formed between each side guide plate 11 and one respective slideway 101, a blocking wall 103 formed corresponding to the rear side of the accommodating chamber 10, a positioning block 12 formed on the front side of the base 1, and a positioning unit 13 extending downward from the bottom side of the base 1 and a fixing part 14 extending laterally.

The retaining member 2 comprises a horizontal portion 21 with a pushing portion 211 at the front end and an operating portion 212 at the rear end, a vertical portion 22 extending downward from the bottom side of the pushing portion 211 and inserted into the accommodating chamber 10 of the base 1, a connecting plate 23 connected to the vertical portion 22, and two positioning blocks 221 respectively located on two opposite lateral sides of the vertical portion 22 and respectively inserted into the limiting grooves 102 of the base 1 to form positioning. The elastic member 3 is set in the accommodating chamber 10 of the base 1 with two opposite ends thereof respectively stopped against the vertical portion 22 and the blocking wall 103. The sliding shaft 4 runs through the connecting plate 23 and the elastic member 3, and both ends of the sliding shaft 4 are positioned in the two slideways 101.

Each of the two side guide plates 11 of the above-mentioned base 1 forms a guide inclined edge 111 with a smooth downward curvature toward the rear side. The positioning block 12 of the base 1 is composed of a semicircular arc-shaped sheet. The suspended end of the preset interface card 53 is correspondingly provided with a semicircular resisting groove 531 that extends into and resists the positioning block 12.

The positioning unit 13 of the above-mentioned base 1 comprises a positioning plate 131 that extends into the wide part 5111 of the positioning groove 511 of the circuit board 51 and slides to the narrow part 5112 to form positioning, and a wing plate 132 extending outward from the positioning plate 131. The fixing part 14 has a lock hole 140 corresponding to the fixing hole 512 of the circuit board 51 for locking with a fastener 15. The fastener 15 is composed of a screw. The circuit board 51 is further provided with an electrical connector 52 on each of the first surface and the second surface. The top surface of the wing plate 132 is further provided with a resisting rib 1321 that smoothly abuts against the narrow part 5112 of the positioning groove 511 of the circuit board 51.

The top side of the pushing portion 211 of the retaining member 2 has a guide inclined surface 2111 that guides the circuit board 51 to rotate downward, and the guide inclined surface 2111 is in the shape of an arc. A limiting surface 2112 is formed on the bottom side of the pushing portion 211, and a sliding surface 2121 is formed on the bottom side of the operating portion 212 relative to the other side of the pushing portion 211. The retaining member 2 further comprises two limiting blocks 24 extending from the horizontal portion 21 toward the connecting plate 23 on both sides and the limiting blocks 24 limit the resisting end portions 31 of the elastic member 3. The opposite inner sides of the limiting blocks 24 and the vertical portion 22 form a respective limiting space 240 for accommodating the resisting end portions 31 of the elastic member 3. The connecting plate 23 of the retaining member 2 is further provided with an axis hole 230 for the sliding shaft 4 to pass through, and the two positioning ends 41 of the sliding shaft 4 are positioned in the two slideways 101 of the base 1 to form positioning.

Figure 5:
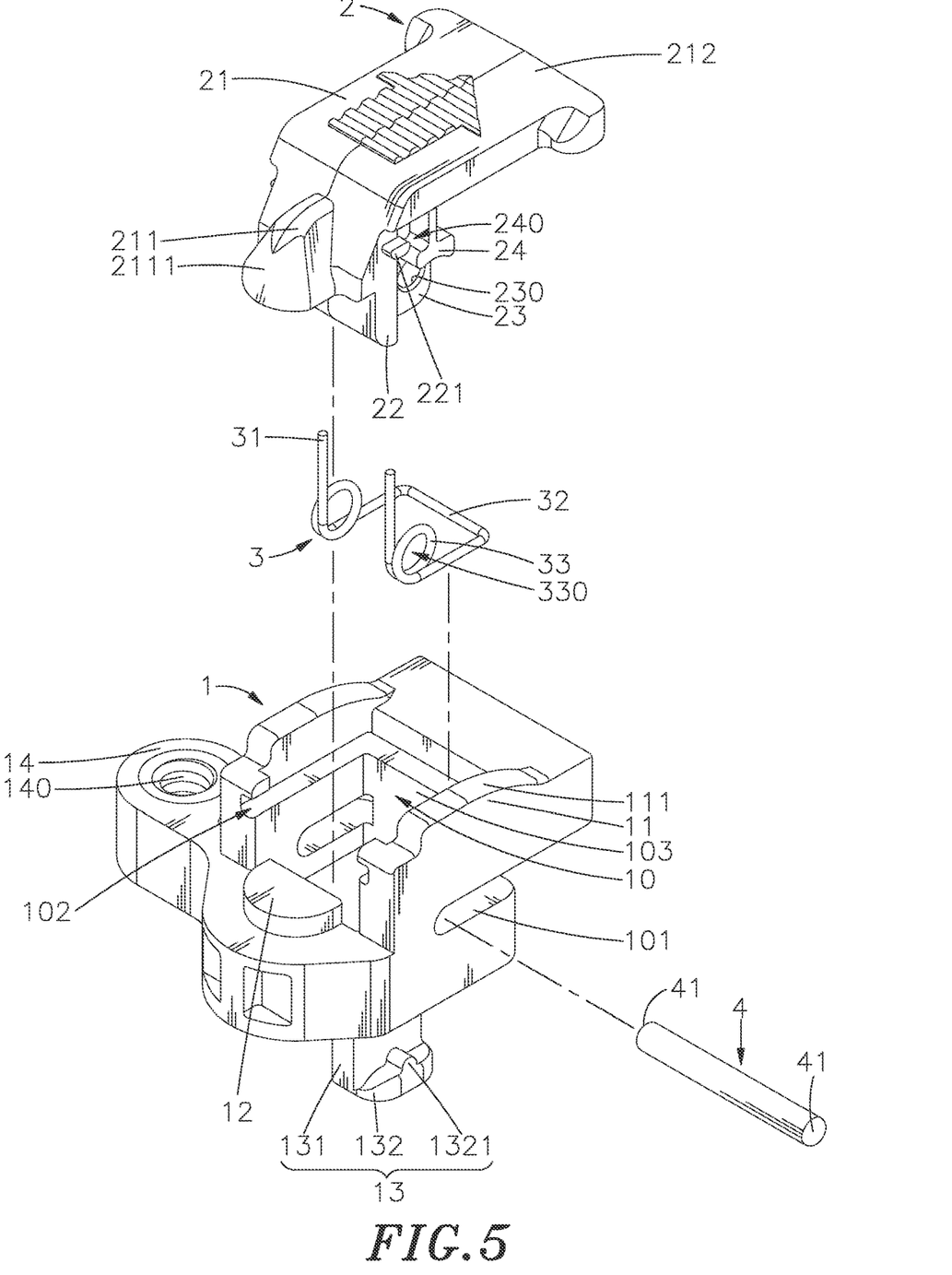
FIG. 5 is a three-dimensional exploded view of the positioning device of the present invention.
Figure 6:
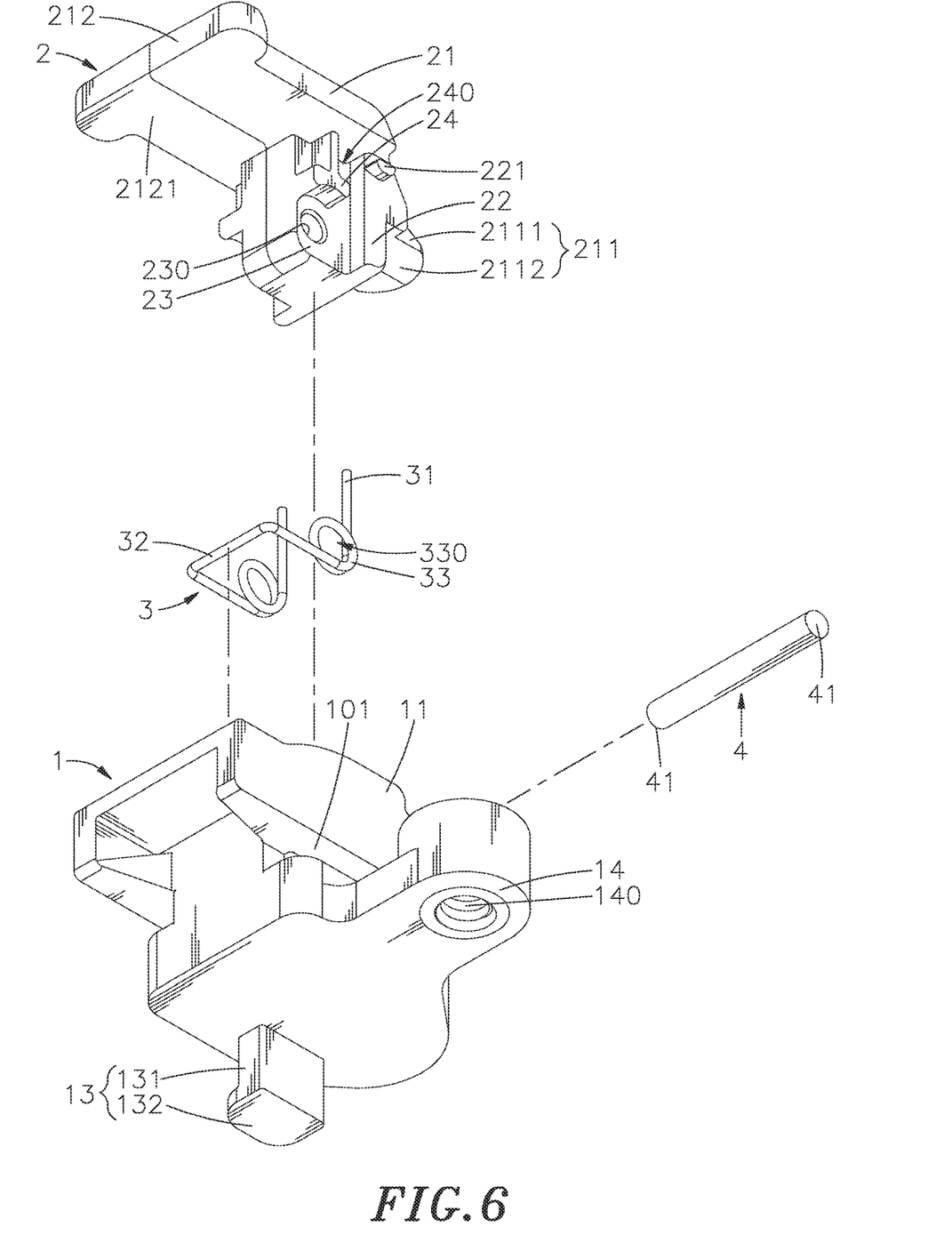
FIG. 6 is another three-dimensional exploded view of the positioning device of the present invention.

The above-mentioned elastic member 3 is a torsion spring. The elastic member 3 is wound in the middle to form two positioning rings 33, and a penetration channel 330 is formed in each positioning ring 33 for the sliding shaft 4 to pass through. The elastic member 3 is formed with a deformation metal wire segment 32 with two ends bent against the blocking wall 103, and the two resisting end portions 31 are formed with metal free wire ends and stopped against the inside of the vertical portion 22 of the retaining member 2.

When assembling the positioning device of the present invention, first extend the two resisting end portions 31 of the elastic member 3 into the limiting spaces 240 on both sides of the connecting plate 23 of the retaining member 2, and use the limiting blocks 24 to limit the two resisting end portions 31. Then align the two penetration channels 330 of the elastic member 3 with the axle hole 230 of the connecting plate 23 at the same time, and press the vertical portion 22 of the retaining member 2, the connecting plate 23 and the elastic member 3 from top to bottom into the accommodating chamber 10 of the base 1 at the same time, so that the positioning blocks 221 on both sides of the vertical portion 22 slide toward the positioning block 12 into the two limiting grooves 102 of the base 1 to form positioning. Then let the resisting end portions 31 of the elastic member 3 resist the inner side of the vertical portion 22 and the deformation metal wire segment 32 resist the blocking wall 103, and align the two penetration channels 330 of the elastic member 3 and the axle hole 230 of the connecting plate 23 with the two slideways 101 of the base 1 at the same time. Then pass the sliding shaft 4 through the two slideways 101, the two penetration channels 330 and the axle hole 230, and position the two positioning ends 41 of the sliding shaft 4 in the two slideways 101 to form positioning. Through the above, the assembly of the positioning device is completed.

Figure 1:
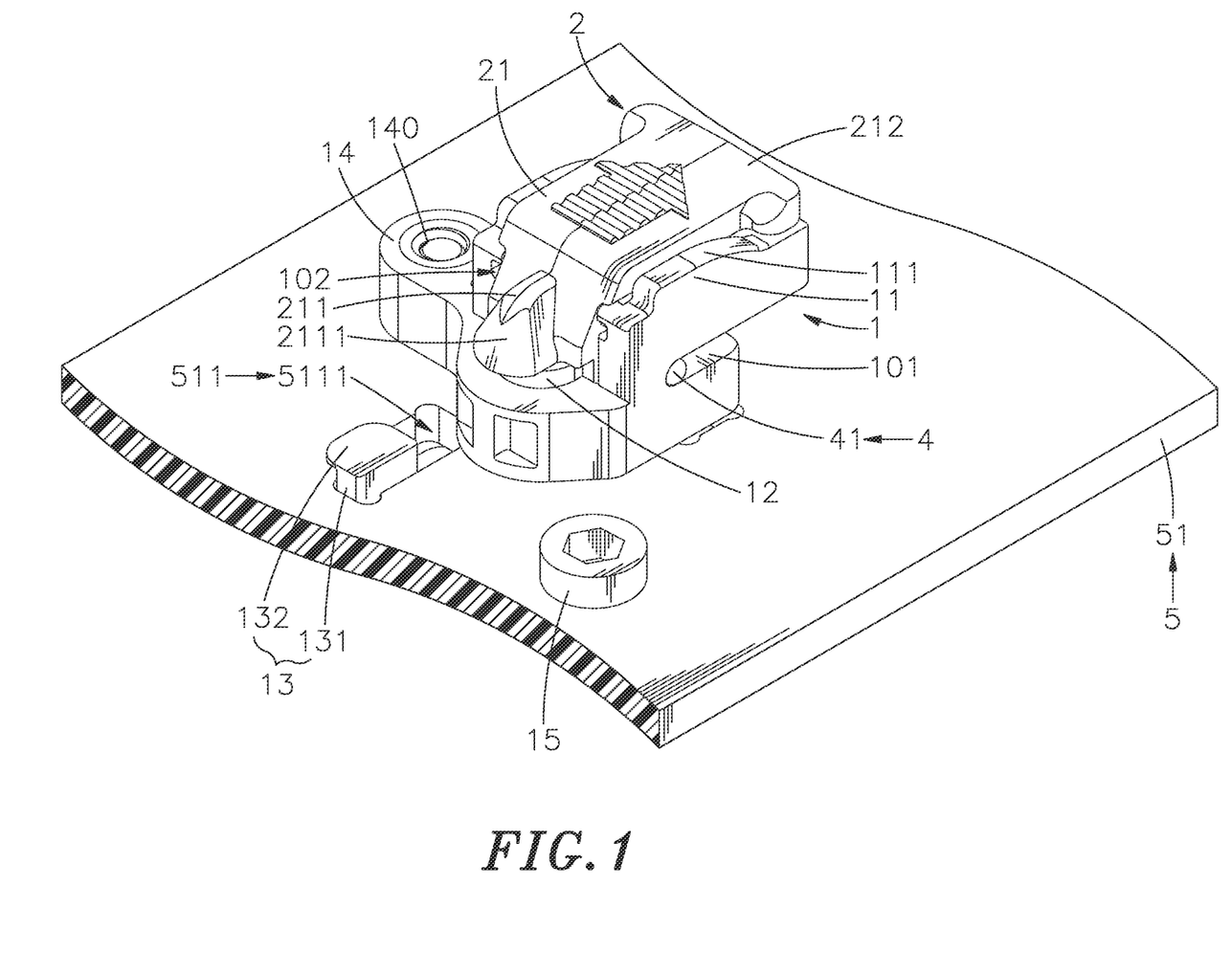
FIG. 1 is a three-dimensional view of an embodiment of a storage module double-layer positioning device set of the present invention.
Figure 2:
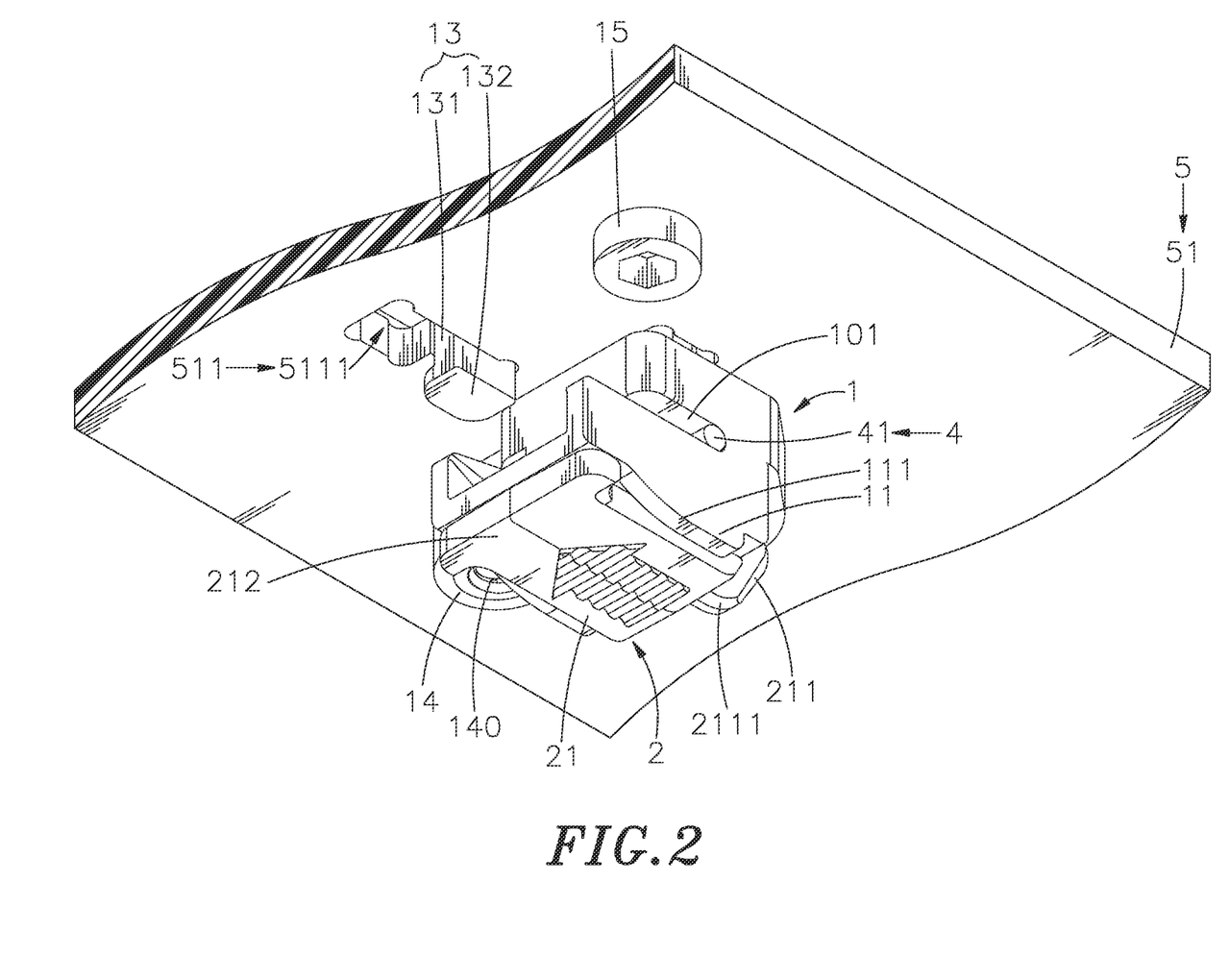
FIG. 2 is another three-dimensional view of the embodiment of the storage module double-layer positioning device set of the present invention.
Figure 3:
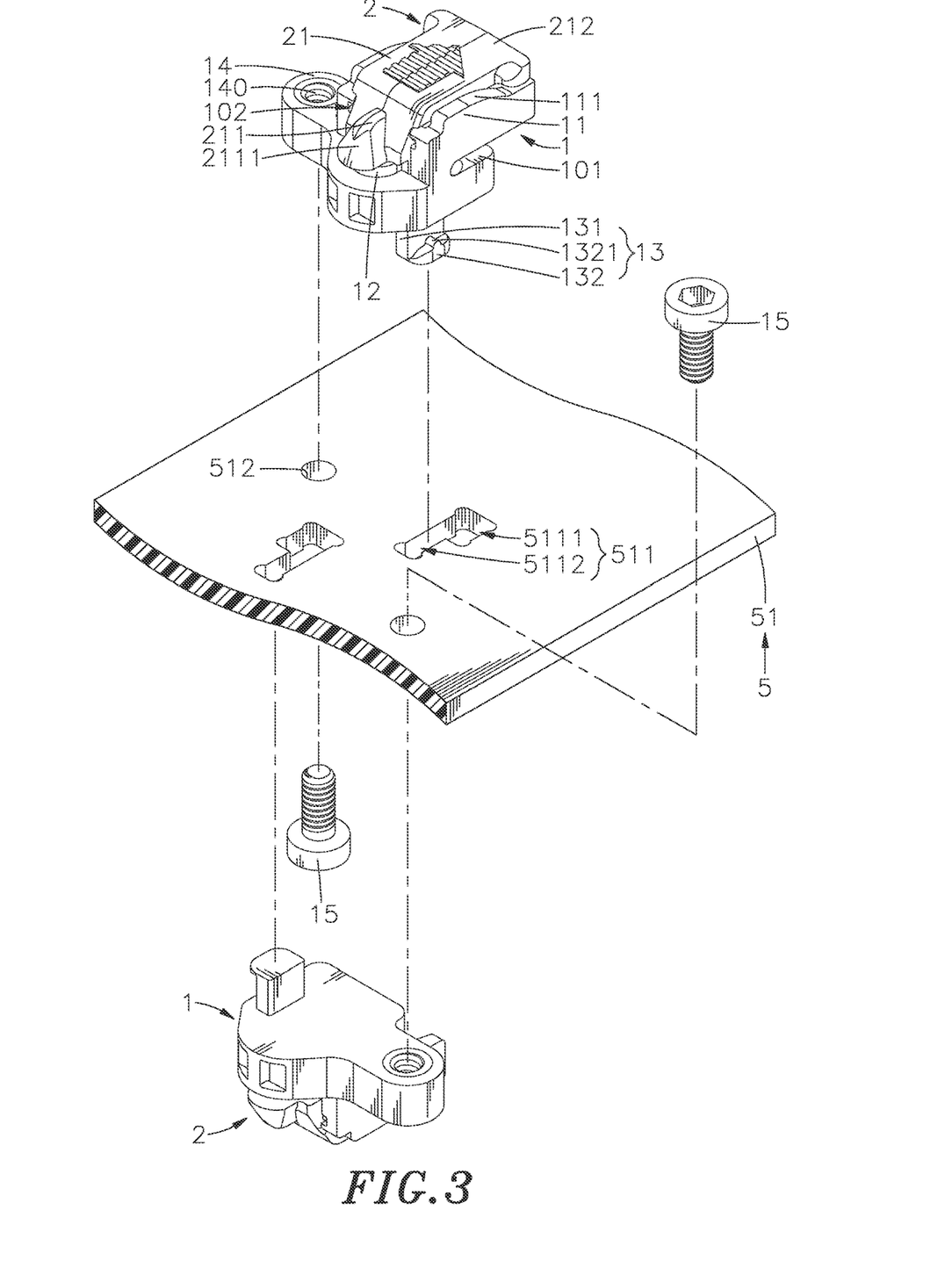
FIG. 3 is a three-dimensional exploded view of the embodiment of the storage module double-layer positioning device set of the present invention.
Figure 4:
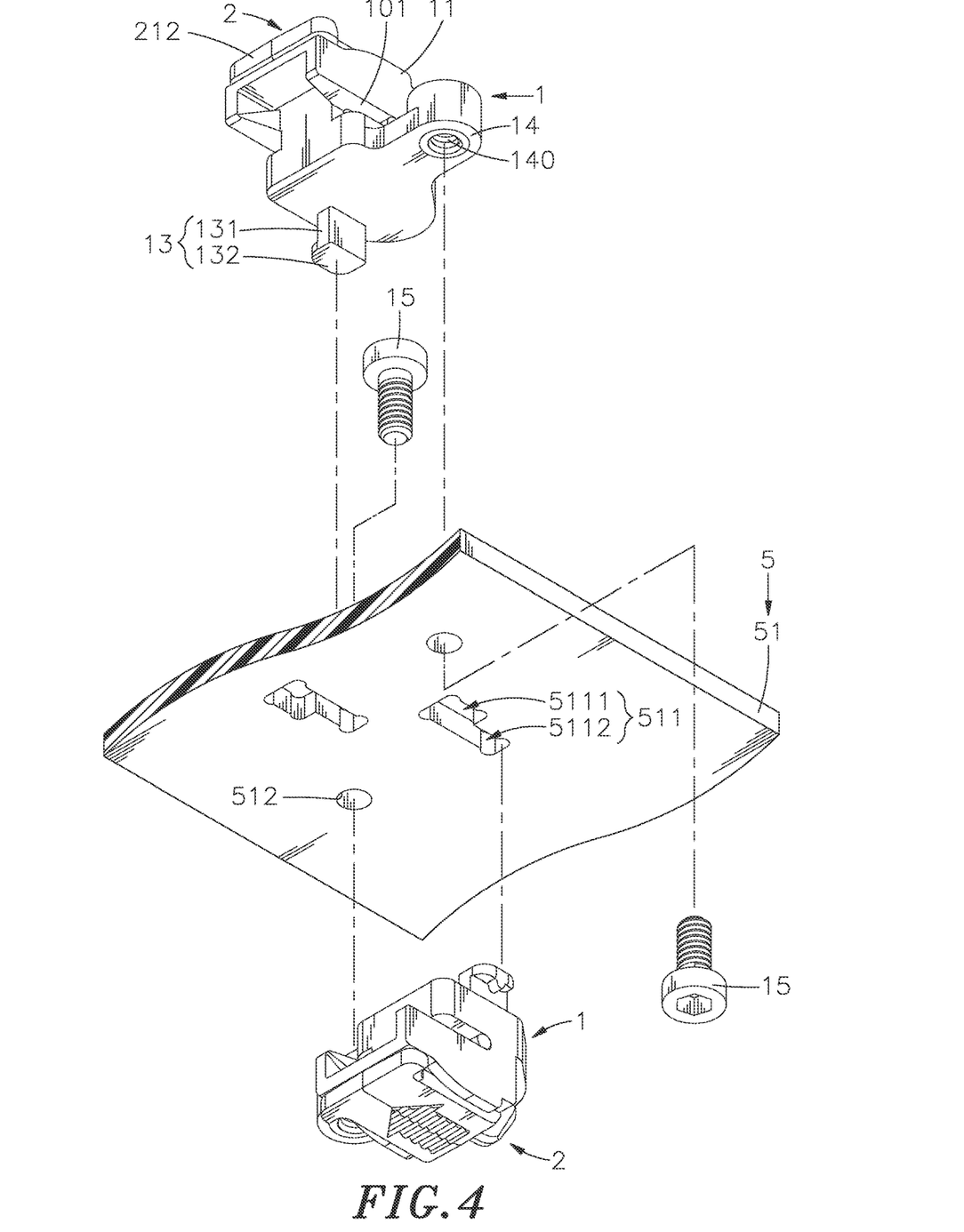
FIG. 4 is another three-dimensional exploded view of the embodiment of the storage module double-layer positioning device set of the present invention.

When you want to install the positioning device on the circuit board 51 of the storage module 5, first make the positioning plate 131 and wing plate 132 of the base 1 penetrate the wide part 5111 of the positioning groove 511 of the circuit board 51 downward. Then apply force to move the base 1 horizontally so that the positioning plate 131 slides from the wide part 5111 to the narrow part 5112. At this time, the top surface of the wing plate 132 is pressed upward against the narrow part 5112 on the bottom side of the circuit board 51, and the lock hole 140 of the fixing part 14 is locked with the fixing hole 512 of the circuit board 51 through the fastener 15, thus completing the assembly of the first surface of the circuit board 51 and the positioning device. The assembly of the second surface of the circuit board 51 and another positioning device can also be completed according to the aforementioned process, and the two positioning devices are arranged in a staggered manner. At the same time, the electrical connectors 52 and interface cards 53 provided on both surfaces of the circuit board 51 are also arranged in a staggered manner. Although this structural design slightly increases the length of the circuit board 51, the overall thickness of the storage module 5 is reduced, making it more flexible for assembly in the limited space of a server or an industrial computer (IPC).

Figure 7:
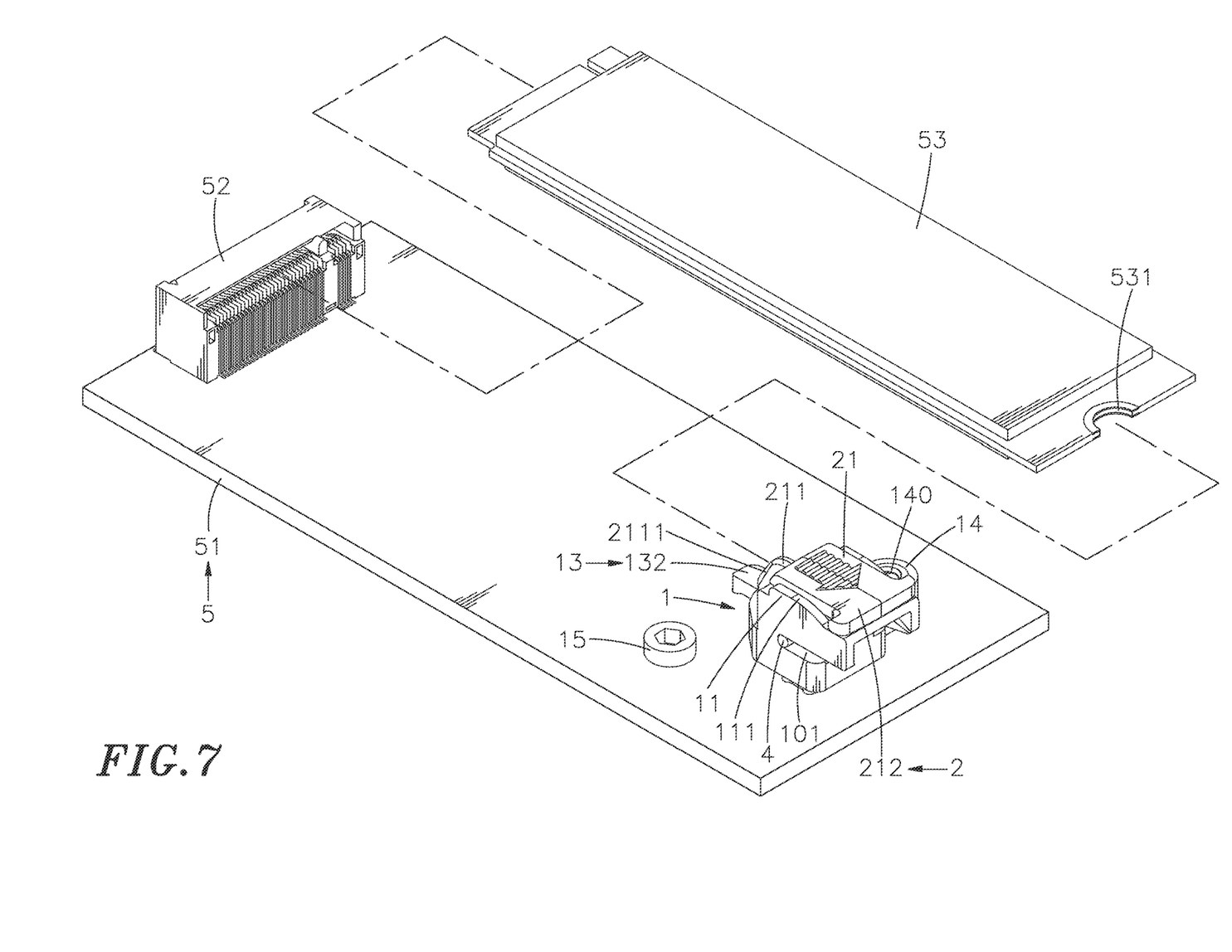
FIG. 7 is a schematic diagram of the first action of the storage module of the present invention during installation.
Figure 8:
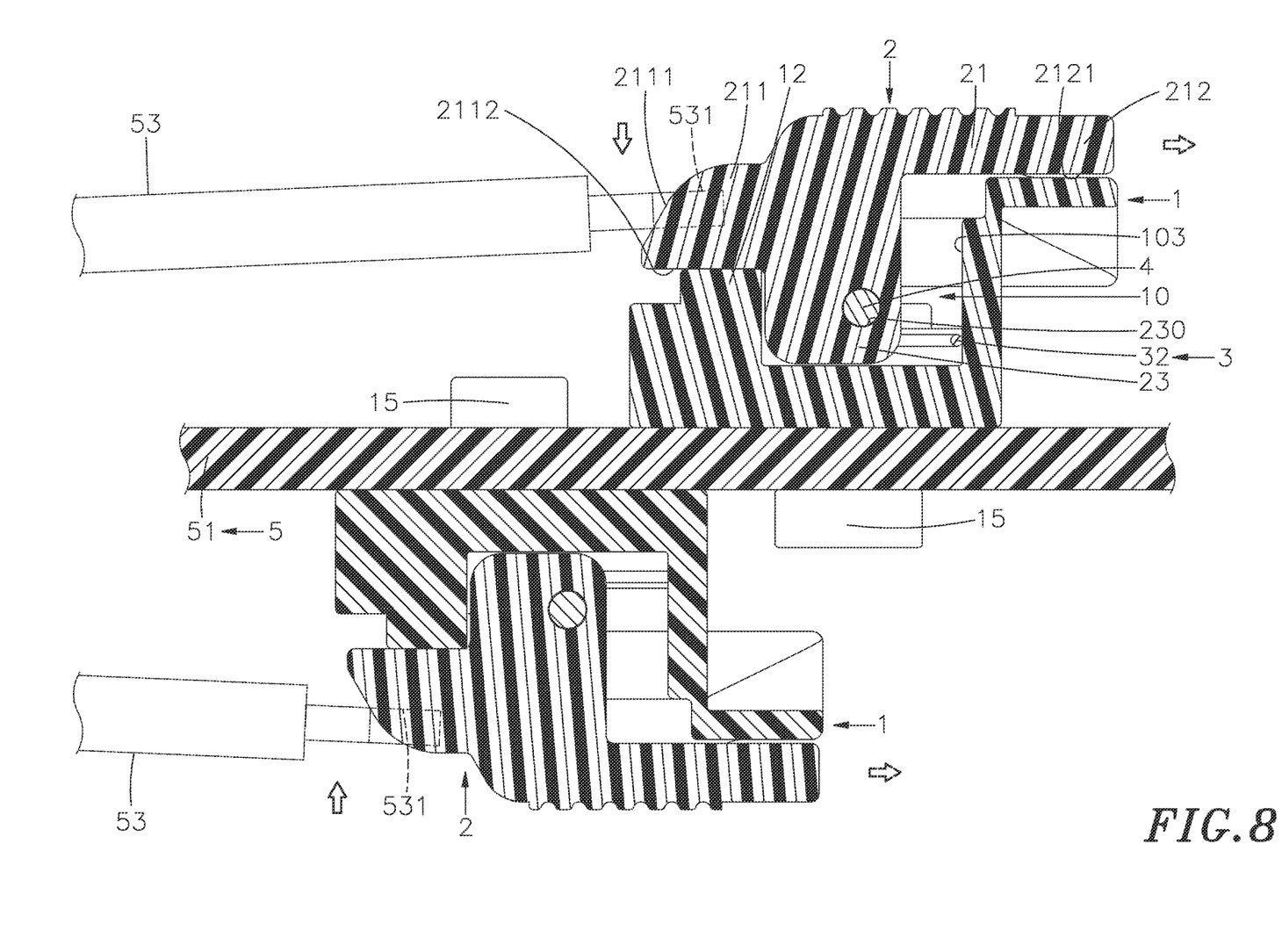
FIG. 8 is a schematic diagram of the second action of the storage module of the present invention during installation.
Figure 9:
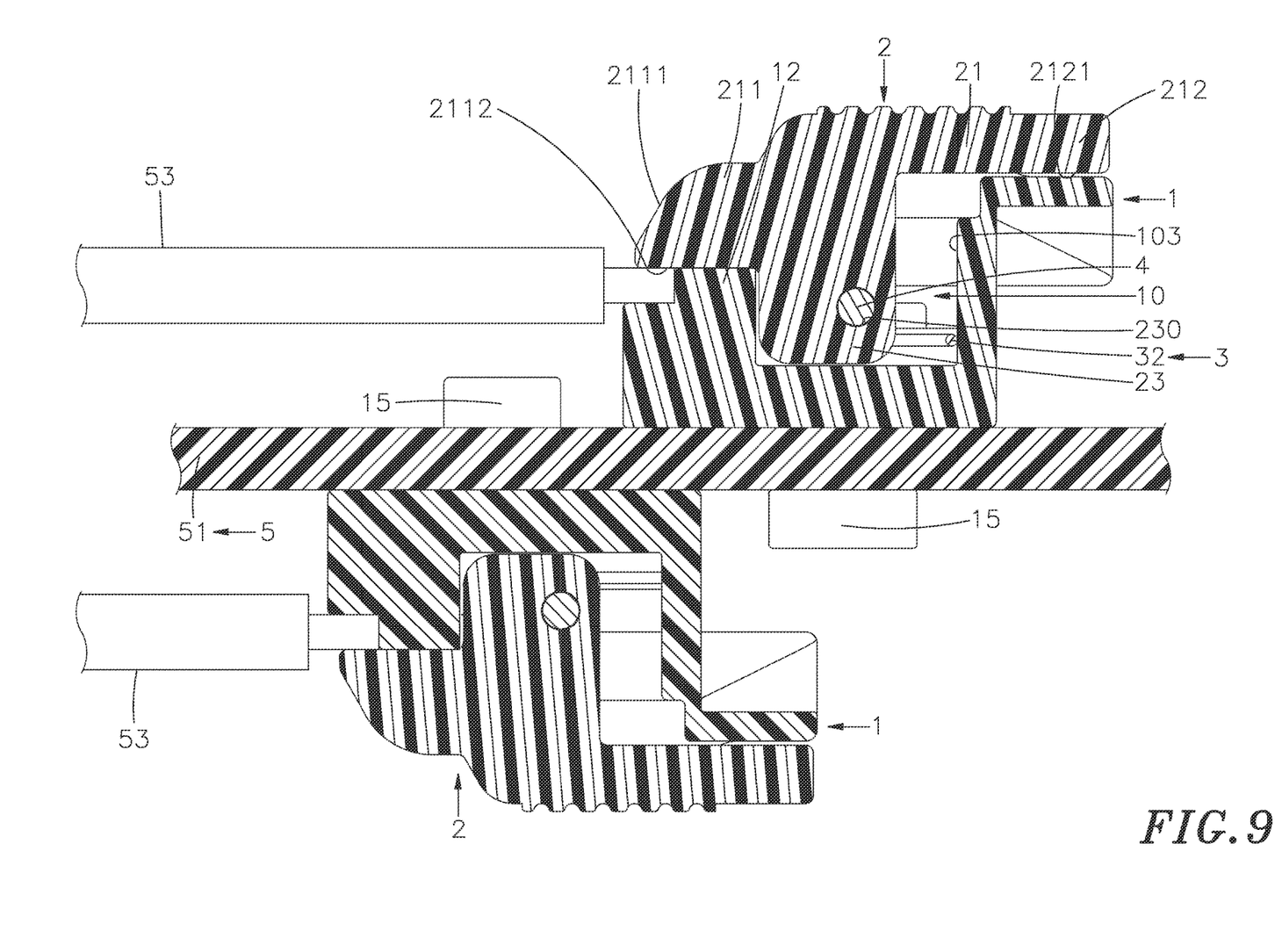
FIG. 9 is a schematic diagram of the third action of the storage module of the present invention during installation.

Please refer to FIGS. 7 to 9, which are schematic diagrams of the first, second and third actions of the storage module during installation of the present invention. The circuit board 51 of the storage module 5 is provided with electrical connectors 52 with oblique docking spaces, and the interface cards 53 of a m.2 specification solid-state drive (SSD) are inserted obliquely into the docking spaces (not labeled) of the electrical connectors 52 and are electrically connected to respective conductive terminals (not labeled). It is necessary to use the positioning device to fix the interface card 53 on the suspended card edge. When you want to position it in the positioning device, you need to use the electrical connector 52 as the rotation axis, and rotate the interface card 53 toward the pushing portion 211 of the retaining member 2, so that the pushing portion 211 is stressed by the interface card 53 in the horizontal direction and retracts, and drives the sliding shaft 4 to move in the two slideways 101 toward the rear side of the base 1, causing the elastic member 3 to compress and deform, so that the interface card 53 rotates downward vertically into the bottom side of the limiting surface 2112 of the pushing portion 211. The positioning block 12 with a semicircular arc-shaped sheet of the base 1 corresponding to the limiting surface 2112 is used for resisting positioning of the resisting groove 531 of the interface card 53. At the same time, the retaining member 2 removes the pushing force of the interface card 53, causing the elastic member 3 to generate an elastic restoring force, driving the pushing portion 211, the elastic member 3 and the sliding shaft 4 to return to their original positions. The top surface of the interface card 53 is limited by the limiting surface 2112 of the retaining member 2, while the side and bottom surfaces of the interface card 53 are stored at the periphery of the positioning block 12. Through the above, the positioning structure of the positioning device and the interface card 53 is completed.

Figure 10:
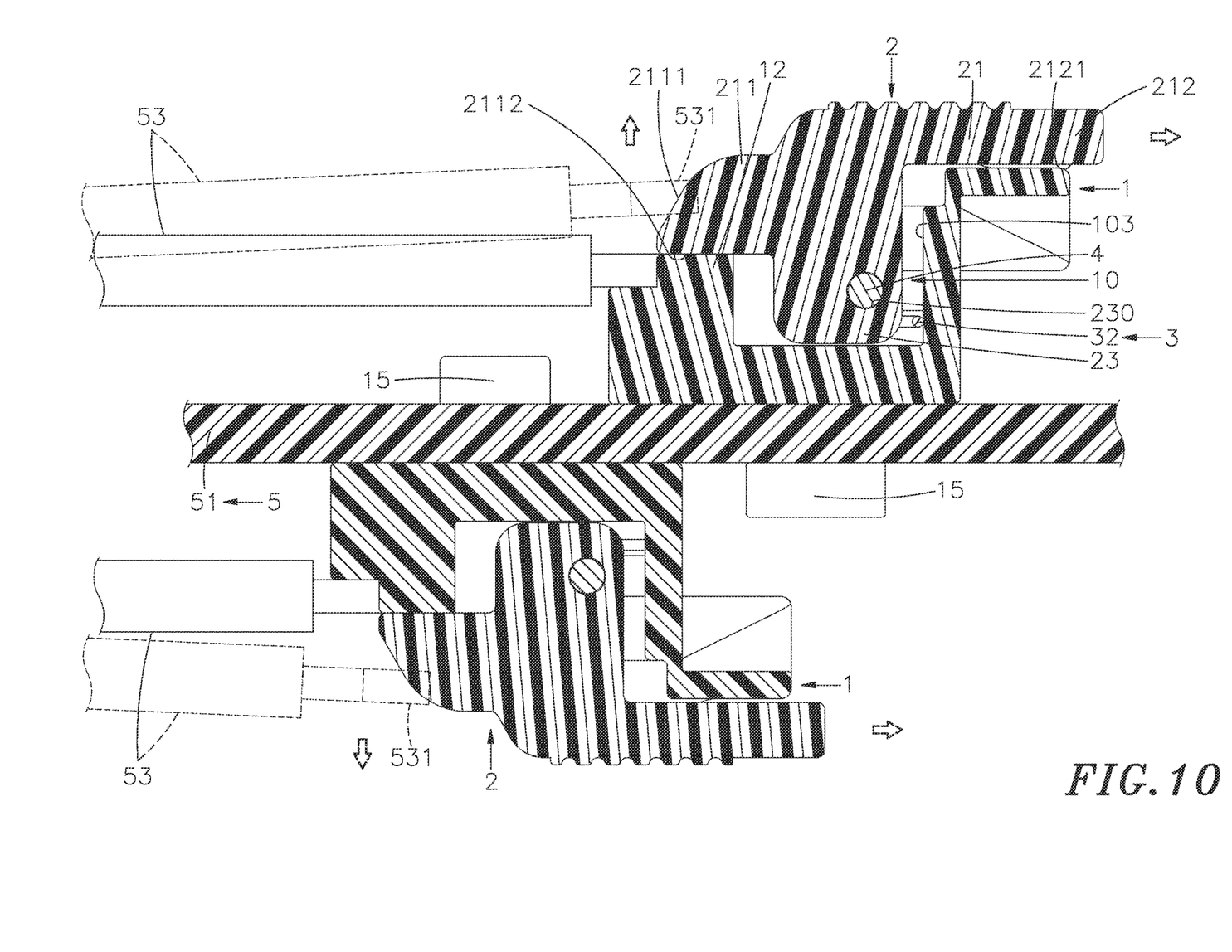
FIG. 10 is a schematic diagram of the operation of the storage module of the present invention when it is disassembled.

Please refer to FIG. 10, which is a schematic diagram of the operation of the storage module during disassembly of the present invention. When you want to remove the positioning device and the interface card 53, first apply force on the operating portion 212 of the retaining member 2 toward the rear side of the base 1, so that the sliding shaft 4 moves a predetermined distance in the slideways 101, and the elastic member 3 generates a great amount of compression, and the sliding surface 2121 on the bottom side of the operating portion 212 slides toward the rear side of the base 1 along the guide inclined edges 111 of the two side guide plates 11. At this time, the interface card 53 is subject to the elastic restoring force of the internal conductive terminals of the electrical connector 52, causing the end surface away from the electrical connector 52 to be tilted. After the resisting groove 531 of the interface card 53 rotates upward to separate from the positioning block 12 and the pushing portion 211, the interface card 53 can be pulled out from the electrical connector 52 diagonally. Then remove the force on the operating portion 212 of the retaining member 2, so that the pushing portion 211, the elastic member 3 and the sliding shaft 4 return to their original positions, and the positioning blocks 221 of the retaining member 2 slide into the two limiting grooves 102 of the base 1. Through the above, the purpose of separating the positioning device and the interface card 53 is achieved. After removing the fastener 15 with a hexagonal groove on the top surface by using a hand tool (such as an Allen wrench), apply force on the positioning device in the horizontal direction to slide the positioning plate 131 from the narrow part 5112 of the positioning groove 511 to the wide part 5111, the positioning device can then be separated upward from the circuit board 51.

The main feature of the present invention is that the circuit board 51 of the storage module 5 is provided with electrical connectors 52, interface cards 53 and positioning devices on both sides. The two positioning devices are locked in the circuit board 51 through fasteners 15 to increase stability. At the same time, the two positioning devices are arranged staggered in the circuit board 51 to reduce the overall thickness of the storage module 5, and the two interface cards 53 are respectively positioned on the upper and lower layers of the circuit board 51 and are electrically connected through corresponding electrical connectors 52 to form a high-density stacked storage capacity. Through this circuit layout form, circuits can be laid on both sides of the circuit board 51 to reduce plated through holes (PTH). In addition to simplifying the circuit complexity and thereby reducing the overall manufacturing cost of the storage module 5. The present invention has excellent practicability in the field of assembly of high-capacity storage devices applied to servers or industrial computers. Therefore, a patent application is filed to seek protection of patent rights.

What is claimed is:

1. A storage module double-layer positioning device set, comprising a storage module with a circuit board and a plurality of positioning devices arranged on opposing first and second surfaces of said circuit board of said storage module in a staggered manner, each said positioning device comprising:
    a base, said base comprising an accommodating chamber inside, two slideways respectively formed on two opposite sides of said accommodating chamber, a side guide plate above each of said two slideways, a limiting groove formed between each said side guide plate and one respective said slideway, a blocking wall formed corresponding to a rear side of said accommodating chamber, a positioning block formed on a front side of said base, and a positioning unit extending downward from a bottom side of said base and a fixing part extending laterally;
    a retaining member, said retaining member comprising a horizontal portion with a pushing portion at a front end thereof and an operating portion at an opposing rear end thereof, a vertical portion extending downward from a bottom side of said pushing portion and inserted into said accommodating chamber of said base, a connecting plate connected to said vertical portion, and two positioning blocks respectively located on two opposite lateral sides of said vertical portion and respectively inserted into said limiting grooves of said base to form positioning;
    an elastic member set in said accommodating chamber of said base, said elastic member comprising two resisting end portions respectively stopped against said vertical portion and said blocking wall; and
    a sliding shaft running through said connecting plate and said elastic member with two opposite ends thereof respectively positioned in said two slideways.

2. The storage module double-layer positioning device set as claimed in claim 1, wherein said positioning unit of said base comprises a positioning plate that extends into a wide part of a positioning groove of said circuit board and slides to a narrow part of said positioning groove of said circuit board to form positioning, and a wing plate extending outward from said positioning plate; said fixing part of said base is provided with a lock hole, said lock hole being locked to a fixing hole on said circuit board by a fastener, said fastener being a screw; said circuit board is provided with an electrical connector on each of said opposing first and second surfaces.

3. The storage module double-layer positioning device set as claimed in claim 2, wherein said wing plate is further provided with a resisting rib on a top surface thereof that smoothly abuts against said narrow part of said positioning groove of said circuit board.

4. The storage module double-layer positioning device set as claimed in claim 1, wherein each said side guide plate of said base forms a guide inclined edge with a smooth downward curvature toward a rear side thereof.

5. The storage module double-layer positioning device set as claimed in claim 1, wherein said positioning block of said base is composed of a semicircular arc-shaped sheet.

6. The storage module double-layer positioning device set as claimed in claim 1, wherein said pushing portion of said retaining member has a guide inclined surface formed on a top side thereof and a limiting surface formed on a bottom side thereof, said guide inclined surface being in the shape of an arc and adapted for guiding said preset interface card to rotate downward; said operating portion has a sliding surface formed on a bottom side thereof relative to the other side of said pushing portion.

7. The storage module double-layer positioning device set as claimed in claim 1, wherein said retaining member further comprises two limiting blocks extending from said horizontal portion toward said connecting plate on both sides to limit said resisting end portions of said elastic member, each of said limiting blocks and said vertical portion defining a respective limiting space for accommodating said resisting end portions of said elastic member respectively.

8. The storage module double-layer positioning device set as claimed in claim 1, wherein said connecting plate of said retaining member is further provided with an axis hole for said sliding shaft to pass through, so that two opposite positioning ends of said sliding shaft are respectively positioned in said two slideways of said base to form positioning.

9. The storage module double-layer positioning device set as claimed in claim 1, wherein said elastic member is a torsion spring, said elastic member comprising a deformation metal wire segment with two ends thereof bent against said blocking wall, the said two resisting end portions stopped against said vertical portion of said retaining member, two positioning rings respectively connected between the two ends of said deformation metal wire segment and said two resisting end portions, and a penetration channel formed in each said positioning ring for said sliding shaft to pass through.

* * * * *